United States Patent
Rebello et al.

(10) Patent No.: US 10,141,506 B2
(45) Date of Patent: Nov. 27, 2018

(54) RESISTIVE SWITCHING CO-SPUTTERED PT—(NIO—AL2O3)—PT DEVICES

(71) Applicant: National University of Singapore, Singapore (SG)

(72) Inventors: Alwyn Rebello, Singapore (SG); Adekunle Adeyeye, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 15/434,949

(22) Filed: Feb. 16, 2017

(65) Prior Publication Data

US 2017/0237002 A1  Aug. 17, 2017

(30) Foreign Application Priority Data

Feb. 17, 2016 (SG) .......................... 10201601176Q

(51) Int. Cl.
    *H01L 45/00* (2006.01)

(52) U.S. Cl.
    CPC .......... *H01L 45/1625* (2013.01); *H01L 45/04* (2013.01); *H01L 45/1233* (2013.01); *H01L 45/146* (2013.01); *H05K 999/99* (2013.01)

(58) Field of Classification Search
    CPC . H01L 45/1625; H01L 45/08; H01L 45/1253; H01L 45/146
    See application file for complete search history.

(56) References Cited

U.S. PATENT DOCUMENTS

| 2007/0200888 A1* | 8/2007 | Inoue | ...... B41J 2/2114 347/16 |
| 2016/0087196 A1* | 3/2016 | Rupp | ...... H01L 45/04 257/4 |
| 2017/0244028 A1* | 8/2017 | Wang | ...... H01L 45/08 |

OTHER PUBLICATIONS

Ai, L., et al., "Influence of Substance Temperature on Electrical and Optical Properties of P-Type Semitransparent Conductive Nickel Oxide Thin Films Deposited by Radio Frequency Sputtering," Elsevier, ScienceDirect, Applied Surface Science, vol. 254, Issue 8, Feb. 15, 2008, pp. 2401-2405.

(Continued)

*Primary Examiner* — Armando Rodriguez
(74) *Attorney, Agent, or Firm* — Cesari and McKenna, LLP; James A. Blanchette

(57) ABSTRACT

In one embodiment, a capacitor-like structure is constructed that includes an RF co-sputtered TMO layer. The capacitor-like structure includes a first electrode (e.g., a bottom electrode) constructed of a first metal (e.g., Pt), a RF co-sputtered TMO layer on the first electrode including a first oxide and a second oxide (e.g., a RF co-sputtered $Al_2O_3$—NiO layer), and a second electrode constructed of a second metal (e.g., Pt) in contact with the co-sputtered TMO layer. The capacitor-like structure is resistively switchable due to formation and rupture of CFs through the RF co-sputtered TMO layer in response to application of a voltage between the first electrode and the second electrode. The RF co-sputtered TMO layer may be grown using at least one direct oxide target (e.g., a NiO target) in a noble gas (e.g., Ar) atmosphere.

17 Claims, 8 Drawing Sheets

(56) References Cited

OTHER PUBLICATIONS

Baikalov, A., et al., "Field-Driven Hysteretic and Reversible Resistive Switch at the Ag—$Pr_{0.7}Ca_{0.3}MnO_3$ Interface," Applied Physics Letters, vol. 83, No. 5, Aug. 4, 2003, pp. 957-959.

Chae, S. C., et al., "Random Circuit Breaker Network Model for Unipolar Resistance Switching," Wiley-VCH Verlag GmBH & Co. KGaA, Advanced Materials, vol. 20, Issue 6, Mar. 7, 2008, pp. 1184-1159.

Chang, S. H., et al., "Percolation Model Explaining Both Unipolar Memory and Threshold Resistance Switching in NiO Film" Physical Review Letters, vol. 102, Jan. 2009, pp. 1-16.

Chang, Y.-F. , et al., "Study of Polarity effect in $SiO_x$-based Resistive Switching Memory," Applied Physics Letters, vol. 101, Aug. 3, 2012, pp. 1-4.

Chang, Y.-F., et al., "Investigation Statistics of Bipolar Multilevel Memristive Mechanism and Characterizations in a Thin FeOx Transition Layer of TiN/SiO2/FeOx/Fe Structure," Journal of Applied Physics,110, Sep. 1, 2011, pp. 1-6.

Chen, Y. F., et al., "Joule-Heating-Enhanced Colossal Magnetorsistance in $La_{0.8}Ca_{0.2}MnO_3$ Films," Applied Physics Letters, vol. 89, No. 082501, Aug. 21, 2006, pp. 1-3.

Choi, B. J., et al., "Resistive Switching Mechanism of $TiO_2$ Thin Films Grown by Atomic-Layer Deposition," American Institute of Physics, Journal of Applied Physics, vol. 98, Aug. 15, 2005, pp. 1-10.

Chua, L. O. , "Memristor—The Missing Circuit Element," IEEE Transactions on Circuit Theory, vol. CT-18, No. 5, Sep. 1971, pp. 507-519.

Dong, R., et al., "Improvement of Reproducible Hysteresis and Resistive Switching in Metal-$La_{0.7}Ca_{0.3}MnO_3$-Metal Heterostructures by Oxygen Annealing," Applied Physics Letters, vol. 90, May 4, 2007, pp. 1-3.

Fursina, A. A., et al., "Origin of Hysteresis in Resistive Switching in Magnetite is Joule Heating," The American Physical Society, Physical Review B, vol. 79, Jun. 26, 2009, pp. 1-6.

Gao, S., et al., "Implementation of Complete Boolean Logic Functions in Single Complementary Resistive Switch," Scientific Reports, vol. 5, Oct. 21, 2015, pp. 1-10.

Guan, W., et al., "Nonvolatile Resistive Switching Memory Utilizing Gold Nanocrystals Embedded in Zirconium Oxide," American Institute of Physics, Applied Physics Letters, vol. 91, Aug. 9, 2007, pp. 1-3.

Hiatt, W. R., et al., "Bistable Switching in Niobium Oxide Diodes," Applied Physics Letters, vol. 6, No. 6, Mar. 15, 1965, pp. 106-108.

Jana, D., et al., "Conductive-Bridging Random Access Memory: Challenges and Opportunity for 3D Architecture," Springer, Nanoscale Research Letters, vol. 10, No. 188, Apr. 18, 2015, pp. 1-23.

Jeong, D. S., et al., "Emerging Memories: Resistive Switching Mechanisms and Current Status," IOP Publishing, Reports on Progress in Physics, vol. 75, Jun. 28, 2012, pp. 1-31.

Jeong, D. S., et al., "Impedance Spectroscopy of $TiO_2$ Thin Films Shoeing Resistive Switching," American Institute of Physics, Applied Physics Letters, vol. 89, Aug. 24, 2006, pp. 1-3.

Jeong, D. S., et al., "Coexistence of Bipolar and Unipolar Resistive Switching Behaviors in a $Pt/TiO_2/Pt$ Stack," Electrochemical and Solid-State Letters, vol. 10, No. 8, May 23, 2007, pp. G51-G53.

Kim, H. J., et al., "Digital Versus Analog Resistive Switching Depending on the Thickness of Nickel Oxide Nanoparticle Assembly," RSC Publishing, RSC Advances, vol. 3, Aug. 22, 2013, pp. 20978-20983.

Lee, S. R., et al., "Resistive Memory Switching in Epitaxially Grown NiO," Applied Physics Letters, vol. 91, Nov. 16, 2007, pp. 1-3.

Lin, C. Y. et al., "Effect of Top Electrode Material on Resistive Switching Properties of $ZrO_2$ Film Memory Devices," IEEE Electron Device Letters. vol. 28, No. 5, May 2007, pp. 366-368.

Liu, Q., et al., "Controllable Growth of nanoscale Conductive Filaments in Solid-Electrolyte-Based ReRAM by Using a Metal Nanocrystal Covered Bottom Electrode," American Chemical Society, ACS Nano, vol. 4, Sep. 20, 2010, pp. 1-7.

Liu, S. Q. et al., Electric-Pulse-Induced Reversible Resistance Change Effect in Magnetoresistive Films, Applied Physics Letters, vol. 76, No. 19, May 8, 2000, pp. 2749-2751.

Mercone, S., et al., "Nonlinear Effects and Joule Heating in I-V Curves in Manganites," Journal of Applied Physics, vol. 98, 2005, pp. 1-5.

Mikheev, E., et al., "Resistive Switching and Its Suppression in $Pt/Nb:SrTiO_3$ Junctions," Macmillan Publishers Limited, Nature Communications, Jun. 2, 2014, pp. 1-8.

Odagawa, A., et al., Colossal Electroresistance of a $Pr_{0.7}Ca_{0.3}MnO_3$ Thin Film at Room Temperature, Physical Review B, vol. 70, Dec. 3, 2004, pp. 1-4.

Pan, F., et al., "Recent Progress in Representative Random Access Memories: Materials, Switching Mechanisms, and Performance," Elsevier, Materials Science and Engineering R, vol. 83, No. 1, Sep. 2014, pp. 1-59.

Rahaman, S. Z., et al., "Repeatable Unipolar/Bipolar Resistive Memory Characteristics and Switching Mechanism Using a Cu Nanofilament in a $GeO_x$ Film," American Institute of Physics, Applied Physics Letters, vol. 101, Aug. 14, 2012, pp. 1-5.

Rebello, A., et al., "Current Driven Discontinuous Insulator-Metal Transition and Low-field Colossal Magnetoresistance in $Sm_{0.6}Sr_{0.4}MnO_3$," Applied Physics Letters, vol. 96, Apr. 15, 2010, pp. 1-3.

Rebello, A., et al., "Pulse Width Controlled Resistivity Switching at Room Temperature in $Bi_{0.8}Sr_{0.2}MnO_3$," Applied Physics Letters, vol. 94, Feb. 2009, pp. 1-15.

Russo, U., et al., "Filament Conduction and Reset Mechanism in NiO-Based Resistive-Switching Memory (RRAM) Devices," IEEE Transactions on Electron Devices, vol. 56, No. 2, Feb. 2009, pp. 186-192.

Sato, et al., "Consideration of Switching Mechanism of Binary Metal Oxide Resistive Junctions Using a Thermal Reaction Model," Applied Physics Letters, vol. 90, Jan. 16, 2007, pp. 1-3.

Sawa, A. et al., Hysteretic Current-Voltage Characteristics and Resistance Switching at a Rectifying $Ti/Pr_{0.7}Ca_{0.3}MnO_3$ Interface, Applied Physics Letters, vol. 85, No. 18, Nov. 1, 2004, pp. 4073-4075.

Sawa, A., et al., "Interface Resistance Switching at a Few Nanometer Thick Perovskite Manganite Active Layers," Applied Physics Letters, vol. 88, Jun. 8, 2006, pp. 1-3.

Sawa, A., "Resistive Switching in Transition Metal Oxides," Elsevier, Ltd., Materials Today, vol. 11, No. 6, Jun. 2008, pp. 28-36.

Seo, S., et al., "Reproducible Resistance Switching in Polycrystalline NiO Films," Applied Physics Letters, vol. 85, No. 23, Dec. 6, 2004, pp. 1-3.

Shima, H., et al., "Resistance Switching in the Metal Deficient-Type Oxides: NiO and CoO," Applied Physics Letters, vol. 91, Jul. 2, 2007, pp. 1-3.

Shin, H., "Characterization of Crystalline Structure and Morphology of NiO Thin Films," American Scientific Publishers, Journal of Nanoscience and Nanotechnology, vol. 11, No. 5, May 2011, 4629-4632.

Tseng, Y.-T., et al., "Complementary Resistive Switching Behavior Induced by Varying Forming Current Compliance in Resistance Random Access Memory," Applied Physics Letters, vol. 106, May 29, 2015, pp. 1-4.

Waser, R., et al., "Nanoionics-Based Resistive Switching Memories," Nature Publishing Group, Nature Materials, vol. 6, Nov. 2007, pp. 833-840.

Waser, R., et al., "Redox-Based Resistive Switching Memories—Nanoionic Mechanisms, Prospects, and Challenges," Wiley-VCH Verlag GmBH & Co. KGaA, Advances Materials, vol. 21, Jul. 6, 2009, pp. 2632-2663.

Wu, H., et al., "A study of Nickel Monoxide (NiO), Nickel Dioxide (ONiO) and $Ni(O_2)$ Complex by Anion Photoelectron Spectroscopy," American Institute of Physics, J. Chem. Phys., vol. 107, Jul. 1997, pp. 16-21.

Yamamoto, T., et al., "Temperature Dependence of the Ideality Factor of $Ba_{1-x}K_xBiO_3$/Nb-doped $SrTiO_3$ All-Oxide-Type-Schottky Junctions," Japanese Journal of Applied Physics, vol. 37, Jul. 15, 1998, pp. 4737-4746.

(56) References Cited

OTHER PUBLICATIONS

Yang, J. J., et al., "Memristive Switching Mechanism for Metal/Oxide/Metal Nanodevices," Macmillan Publishers Limited, Nature Nanotechnology, vol. 3, Jun. 15, 2008, pp. 429-433.

* cited by examiner

RESISTIVE SWITCHING CO-SPUTTERED PT—(NIO—AL2O3)—PT DEVICES

RELATED APPLICATIONS

The present application claims priority to Singapore Patent Application No. 10201601176Q, titled Large and Robust Resistive Switching in Co-sputtered Pt—(NiO—Al2O3)-Pt Devices, filed Feb. 17, 2016 by Applicant National University of Singapore, the contents of which are incorporated by reference herein in their entirety.

BACKGROUND

Technical Field

The present disclosure relates generally to alternatives to charge based memory and more specifically to resistive switched capacitor-like structures.

Background Information

In modern microelectronic devices, the dominant memory types are dynamic random access memory (DRAM), static RAM (SRAM), and flash memory. These types of memory store data as a charge state and therefore are typically referred to as "charged based memory". For many decades, charged based memory technology has been successfully scaled down to achieve increased density at lower bit cost. However, charged based memories is gradually approaching its physical limits, such that as device size shrinks there are increasing issues involving low operating speed, high power consumption and other scaling limitations.

Memory devices based on resistive switching, such as resistive random access memory (ReRAM), are a promising alternative to charge based memory, due in part to their potential for ultra-high density, high-speed operation, non-volatility, and compatibility with conventional complementary metal-oxide-semiconductor (CMOS) processes. Resistive switching refers to a voltage pulse induced change in the resistance of a material from a low-resistance state ("LRS") (i.e., an "ON" state) to a high-resistance state ("HRS") (i.e., an "OFF" state), and vice versa. Such change in the resistance between the states may be measured as an "ON-OFF" ratio.

Resistive switching is mainly observed in capacitor-like structures. As used herein, the term "capacitor-like structure" refers to a structure comprising an insulating or semiconducting layer that exhibits reversible switching. In a capacitor-like structure, the insulating or semiconducting layer is typically sandwiched between two electrodes. An induced resistance change in the insulating or semiconducting layer is generally referred to as "electroresistance".

The resistive switching effect is widely attributed to the formation and rupture of conducting nano-filaments (CF) in an insulating matrix due to nano-ionic and thermal effects. Typically, an initial step, referred to as "electroformation", forms the CFs in a pristine device. This prerequisite step involves the application of a sufficient voltage to the highly insulating pristine device to form CFs.

Attempts gave been made to improve the resistive switching characteristics (e.g., the ON-OFF ratio, ability to recover to the HRS, endurance to repeated switching cycles, electroresistance in the HRS, etc.) of capacitor-like structures by tailoring chemical and physical properties, to permit the manufacture of higher performance ReRAMs. A variety of approaches have been attempted, including approaches that involve annealing, active electrodes, interface engineering and nan-crystal inducing processes. However, these approaches have met with a number of problems, and the CFs produced have had various shortcomings. As a result, ReRAM development has been slow and it has yet to supplant traditional charge based memory in the overall commercial market.

Accordingly, there is a need for a new type of capacitor-like structure that may have applications in ReRAMs.

SUMMARY

In one embodiment, a capacitor-like structure is constructed that includes a radio frequency (RF) co-sputtered transition metal oxide (TMO) layer. The capacitor-like structure includes a first electrode (e.g., a bottom electrode) constructed of a first metal (e.g., platinum (Pt)), a RF co-sputtered TMO layer on the first electrode including a first oxide and a second oxide (e.g., a RF co-sputtered aluminum oxide-nickel oxide ($Al_2O_3$—NiO) layer having a composition of substantially 84% NiO and 16% $Al_2O_3$), and a second electrode constructed of a second metal (e.g., Pt) in contact with the RF co-sputtered TMO layer. The capacitor-like structure is resistively switchable due to formation and rupture of CFs through the RF co-sputtered TMO layer in response to application of a voltage between the first electrode and the second electrode. The RF co-sputtered TMO layer may be grown using at least one direct oxide target (e.g., a NiO target) in a noble gas (e.g., argon (Ar)) atmosphere. Such a capacitor-like structure may exhibit desirable resistive switching characteristics (e.g., a large ON-OFF ratio, a robust ability to recover to the HRS, strong endurance to repeated switching cycles, high electroresistance in the HRS, etc.) making it well suited for use in ReRAM.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION OF EXAMPLE EMBODIMENTS

An Example Capacitor-Like Structure with a Co-Sputtered TMO Layer

Figure 1:
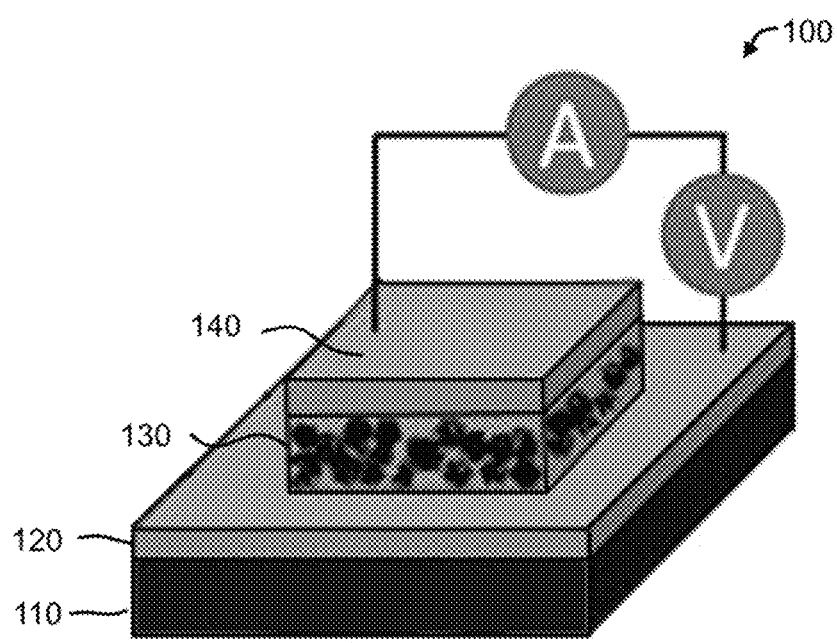
FIG. 1 is a schematic diagram of an example capacitor-like structure that includes a co-sputtered TMO layer.

FIG. 1 is a schematic diagram of an example capacitor-like structure 100 that includes a co-sputtered TMO layer. The capacitor-like structure 100 is formed as a tri-layer upon a substrate 110 (e.g., a silicon oxide/silicon ($SiO_2$/Si) substrate) and includes a bottom electrode 120 constructed of a first metal (e.g., a first Pt layer) having a first thickness (e.g., 200 nanometers (nm)), a co-sputtered TMO layer 130 including a first oxide and a second oxide (e.g., a co-sputtered $Al_2O_3$—NiO layer) having a second thickness (e.g., 60 nm) and a top electrode 140 constructed of a second metal (e.g., a second Pt layer) having a third thickness (e.g., 200 nanometers (nm)).

In this example, the co-sputtered TMO layer 130 and top electrode 140 are deposited in a patterned area (e.g., a 75 µm×75 µm patterned area), while the bottom electrode 120 covers a greater portion of the substrate 110 (e.g., the whole substrate). However, it should be understood that such different coverage is not necessary, and the two electrodes and the co-sputtered TMO layer may cover the same area on the substrate.

The electrodes may be formed using standard photolithography and lift-off. The co-sputtered TMO layer (e.g., the co-sputtered $Al_2O_3$—NiO layer) may be grown using RF co-sputtering that uses a direct oxide target for at least one of the oxides (e.g., a NiO target) in a noble gas (e.g., Ar) atmosphere). As shown in the experimental testing results below, RF co-sputtering using a direct oxide target may be less prone to synthesis parameters and may yield a layer that significantly differs (e.g., has a different peak structure and intensity) from more commonly used direct current (DC) reactive co-sputtering of metals (e.g., Ni) in a partial oxygen atmosphere. The growth process may be controlled to produce a TMO layer having a composition of substantially predetermined amounts of each oxide, (e.g., substantially 84% $Al_2O_3$ and 16% NiO). For purposes of this application, in this context "substantially" refers to a percentage within ±10% (e.g., substantially 84% $Al_2O_3$ and 16% NiO being 74%-94% $Al_2O_3$ and 6%-26% NiO, respectively).

The capacitor-like structure 100 with a co-sputtered TMO layer, as prepared, is initially in a HRS (i.e. OFF state) and requires electroformation to be driven to the LRS (i.e. ON state). The co-sputtered TMO layer (e.g., the co-sputtered $Al_2O_3$—NiO layer) is considered as a matrix of semiconducting an insulating clusters. A voltage induced percolation effect takes place in the matrix during electroformation, which aids in the formation of CFs through the TMO layer, thereby switching the device to the LRS (i.e. ON state). In operation after electroformation, to transition the capacitor-like structure 100 from HRS (i.e. OFF state) to the LRS (i.e. ON state) (such transition being referred to as a "RESET" process) the CFs are disrupted by thermally assisted local chemical reactions. Once the current reduces to a low value in the HRS (i.e. OFF state), no further reaction occurs due to cooling of the TMO layer. To transition the capacitor-like structure 100 from LRS (i.e. ON state) to the HRS (i.e. OFF state) after electroformation (such transition being referred to as a "SET" process) the CFs are reformed.

The capacitor-like structure 100 with a co-sputtered TMO layer made using an RF process may have improved the resistive switching characteristics and other desirable properties in comparison to devices that do not employ multiple different oxides or RF processes, for example structures produced by DC reactive sputtering that uses a pure oxide (e.g., pure NiO). The capacitor-like structure 100 with a co-sputtered TMO layer may have a larger ON-OFF ratio, for example an ON-OFF ratio as high as approximately $10^7$, depending on the voltage sweep rate. A larger ON-OFF ratio is a desirable characteristic of a nonvolatile memory. Further the capacitor-like structure 100 may fully recovery to HRS of the pristine device. In comparison, normally during the RESET process of a NiO based capacitor-like structure, the resistance does not recover fully to the HRS of the pristine device. Likewise, the capacitor-like structure 100 with a co-sputtered TMO layer may have high endurance to repeated switching cycles, such that the ON-OFF ratio is maintained over use. Still further, the capacitor-like structure 100 with a co-sputtered TMO layer may provide robust electroresistance in the HRS. In addition to such electroresistance, the capacitor-like structure 100 with a co-sputtered TMO layer may exhibit a change of sign of rectification behavior from positive to negative (i.e. a crossover of rectification behavior) in response to an increase in end voltage in the HRS. This behavior in the HRS (i.e. OFF state) is in sharp contrast to that observed in capacitor-like structures based a pure oxide (e.g., pure NiO).

Experimental Results and Discussion

For testing purposes, an example Pt/NiO—$Al_2O_3$/Pt capacitor-like structure was constructed by co-sputtering a NiO—$Al_2O_3$ layer at room temperature using NiO (99.99%) and $Al_2O_3$ targets at an RF power of 100 W and $3\times10^{-3}$ Torr working pressure and in a deposition chamber with a base pressure of less than $3\times10^{-8}$ Torr. Current-voltage characteristics were measured with two DC probes (on xyz stages) using a source measure unit. A Bruker x-ray diffractometer in grazing incidence mode was used to examine the phase of the deposited layer.

Figure 2:
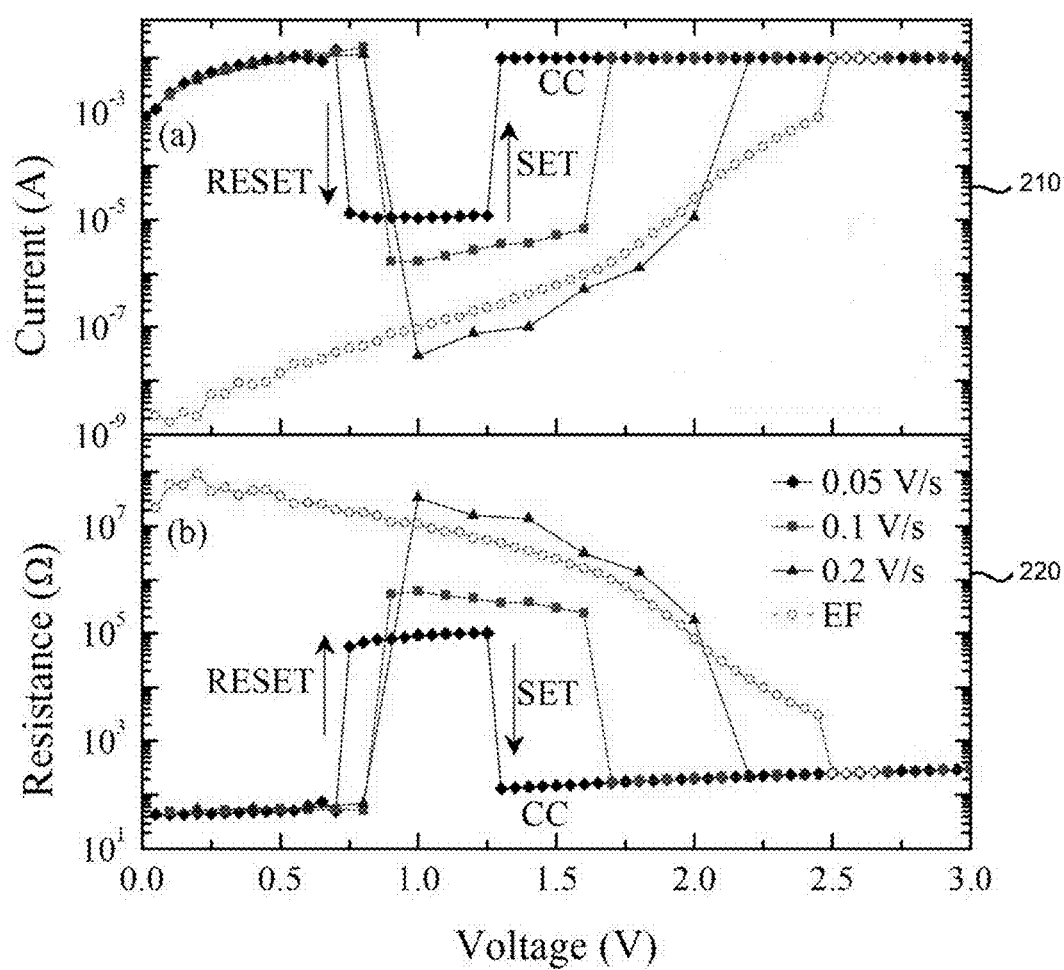
FIG. 2 is a plot of current-voltage (I-V) behavior of an example Pt/NiO—$Al_2O_3$/Pt capacitor-like structure in the pristine state and for different voltage sweep rates, including 0.05, 0.1 and 0.2 V/s, and a plot of corresponding changes in resistance.

FIG. 2 is a plot 210 of current-voltage (I-V) behavior of the example Pt/NiO—$Al_2O_3$/Pt capacitor-like structure in the pristine state and for different voltage sweep rates, including 0.05, 0.1 and 0.2 V/s, and a plot 220 of corresponding changes in resistance. The I-V curves for different sweep rates show resistive switching characteristics with the device undergoing a RESET process at a threshold voltage magnitude $V_{RESET}$ and a SET process at a higher threshold voltage magnitude $V_{SET}$. During the SET process, the magnitude of current increases drastically and, therefore, proper compliance current (CC) is set to protect the device from break down. For a sweep rate of 0.05 V/s, resistance changes from ~40 Ω to 50 Ω during the RESET process, whereas it changes from ~50 Ω to 500 kΩ for a sweep rate of 0.1 V/s.

As can be seen from FIG. 2, the example Pt/NiO—$Al_2O_3$/Pt capacitor-like structure exhibits different behavior from structures constructed using only NiO. First, it can be seen that the Pt/NiO—Al$_2$O$_3$/Pt capacitor-like structure shows a large ON-OFF ratio (e.g., as high as approximately 10$^7$) which strongly depends on the voltage sweep rate. Second, it can be seen that the Pt/NiO—Al$_2$O$_3$/Pt capacitor-like structure exhibits a robust ability to recover to the HRS of the pristine device. During the RESET process of a NiO-based capacitor-like structure, the resistance does not recover fully to the HRS of the pristine device, and the value of resistance is typically just a few hundreds of kilo-Ohms. In contrast, looking to the sweep rate of 0.2 V/s, it can be seen that the resistance of the Pt/NiO—Al$_2$O$_3$/Pt capacitor-like structure shows a large change from ~50 Ω to 30 MΩ, indicating a full recovery to HRS of the pristine device.

Figure 3:
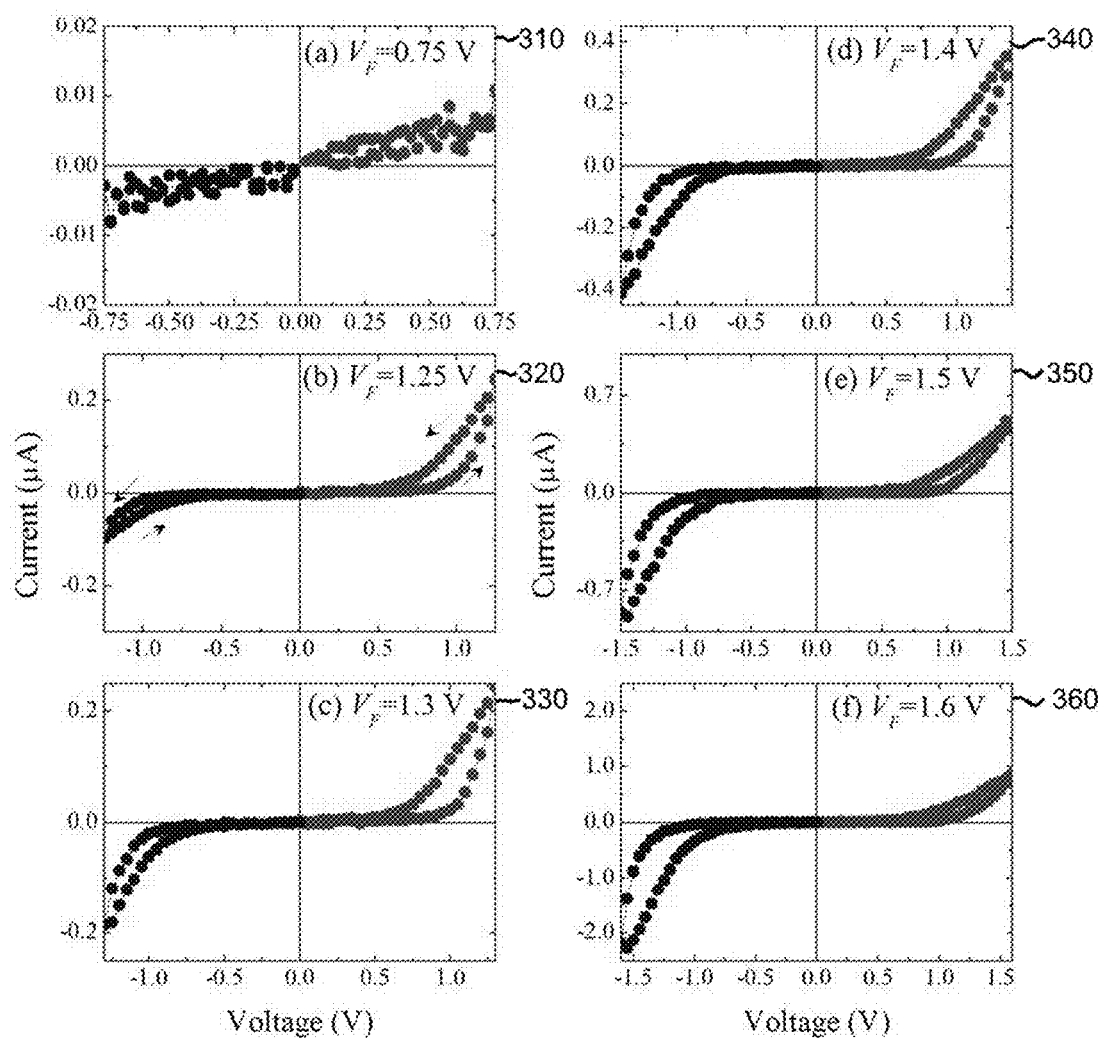
FIG. 3 is a collection of plots showing I-V curves of the example Pt/NiO—$Al_2O_3$/Pt capacitor-like structure when voltage is swept from 0 to a positive end voltage (+$V_F$), to a negative end voltage (–$V_F$) and then back to 0 V, for $V_F$ equal to 0.75, 1.25, 1.3, 1.4, 1.5, and 1.6 V.

Further, the example Pt/NiO—Al$_2$O$_3$/Pt capacitor-like structure exhibits robust electroresistance in the HRS (i.e. OFF state). FIG. 3 is a collection of plots 310-360 showing I-V curves of the example Pt/NiO—Al$_2$O$_3$/Pt capacitor-like structure when voltage is swept from 0 to a positive end voltage (+V$_F$), to a negative end voltage (-V$_F$) and then back to 0 V, for V$_F$ equal to 0.75, 1.25, 1.3, 1.4, 1.5, and 1.6 V. I-V measurements were performed after triggering the RESET process with a voltage sweep rate of 0.2 V/s. For V$_F$ equal to 0.75 V, the I-V characteristics are linear and symmetric. In contrast, the I-V characteristics for V$_F$ equal to 1.25 V shows a strong nonlinear behavior with prominent hysteresis in the first quadrant of the voltage sweep. Moreover, the device shows a rectification behavior, manifested by the clear asymmetry in the first and third quadrant of the voltage sweep. When V$_F$ is increased to 1.4 V, the asymmetry in the I-V curve significantly reduces, though the device shows a prominent nonlinear behavior in the positive and negative quadrants of the voltage sweep. When the end voltage is increased to 1.6 V, the device exhibits a prominent nonlinear I-V behavior with the re-emergence of large rectification in the opposite direction.

As used herein, "rectification percentage" (RP) is defined as the ratio of difference in magnitude of current at +V$_f$ and -V$_f$ to the maximum magnitude of current I$_{max}$, i.e., RP (%)=(I(+V$_F$)-abs[I(-V$_F$)])/abs[I(±V$_F$)]*100. For comparison between opposite rectification behavior, the difference in current values at +V$_F$ and -V$_F$ may be divided by the larger current magnitude, i.e., current at +V$_F$ for low-end voltages (i.e. V$_F$<1.4 V) and current at -V$_F$ for high-end voltages (i.e. V$_F$≥1.4 V). In testing of the example Pt/Ni(O—Al$_2$O$_3$/Pt capacitor-like structure, values of RP of approximately 3, 62, -12, and -60 may be produced for V$_F$ equal to 0.75, 1.25, 1.4, and 1.6 V, respectively. While the RP for V$_F$<1.4 V is positive, it is negative for V$_F$≥1.4 V, strongly manifesting a crossover of rectification behavior with increasing end voltage. After repeated measurements at higher stop voltages (V$_F$≥1.4 V), the example Pt/NiO—Al$_2$O$_3$/Pt capacitor-like structure still shows positive RP again for low stop voltages (V$_F$<1.4 V). Furthermore, the I-V curves exhibits a highly reproducible rectification behavior with repeated voltage sweeps.

Figure 4:
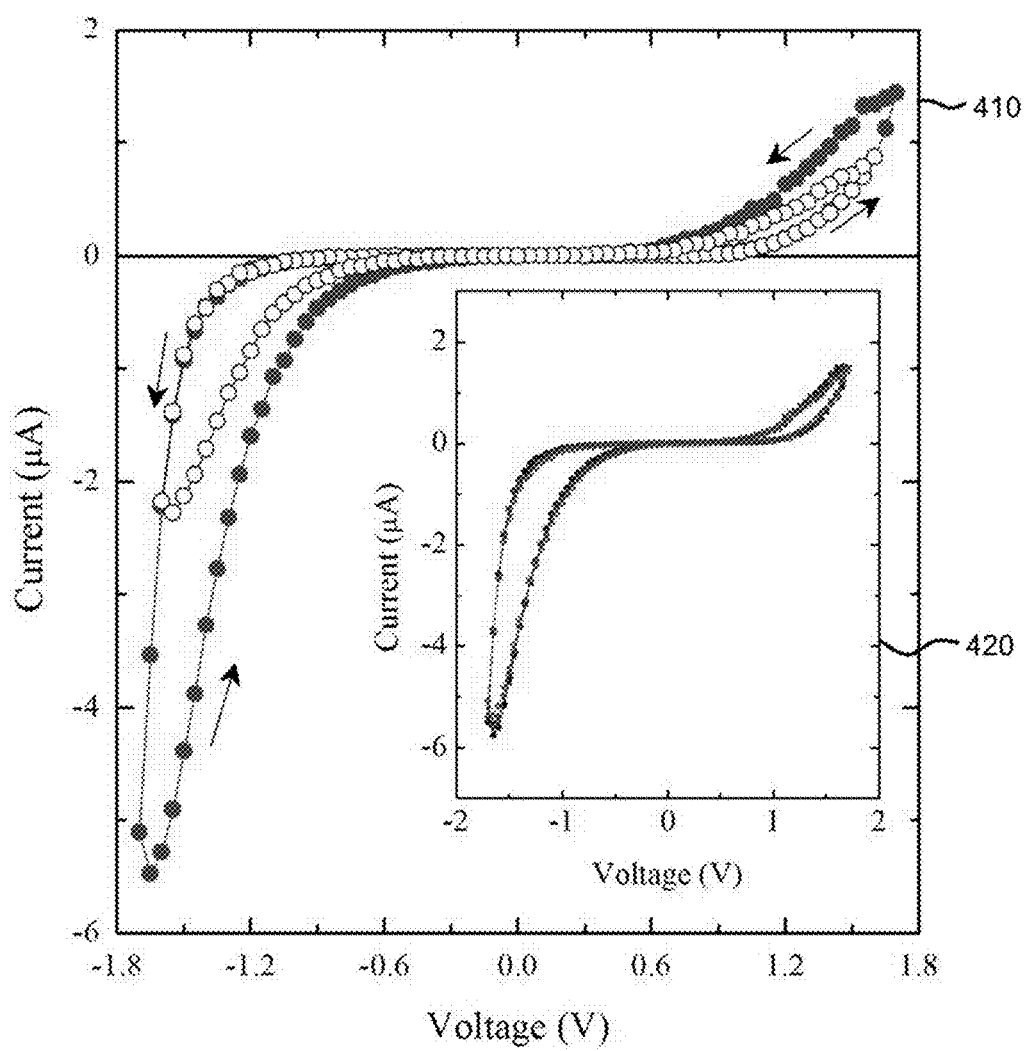
FIG. 4 is a plot of I-V curves of the example Pt/NiO—$Al_2O_3$/Pt capacitor-like structure when voltage is swept from 0 to $V_F$ to –$V_F$ and then back to 0 V, for $V_F$ equal to 1.7 V (shown by the curve with solid circles) and $V_F$ equal to 1.5 V (shown by the curve with open circles), and an insert that shows five repeated I-V curves for $V_F$ equal to 1.7 V.

FIG. 4 is a plot 410 of I-V curves of the example Pt/NiO—Al$_2$O$_3$/Pt capacitor-like structure when voltage is swept from 0 to V$_F$ to -V$_F$ and then back to 0 V, for V$_F$ equal to 1.7 V (shown by the curve with solid circles) and V$_F$ equal to 1.5 V (shown by the curve with open circles), and an insert 430 that shows five repeated I-V curves for V$_F$ equal to 1.7 V. As can be seen from plot 410, the I-V curves for different end voltages follow the same path during the upward voltage sweep in both the positive direction and the negative direction. Likewise, as can be seen from the insert 420, the repeated I-V curves at the same V$_F$ are nearly indistinguishable. The behavior in the HRS (i.e. OFF state) is in sharp contrast to that observed in a NiO-based capacitor-like structure, where the repeated current-voltage curves significantly differ.

Figure 5:
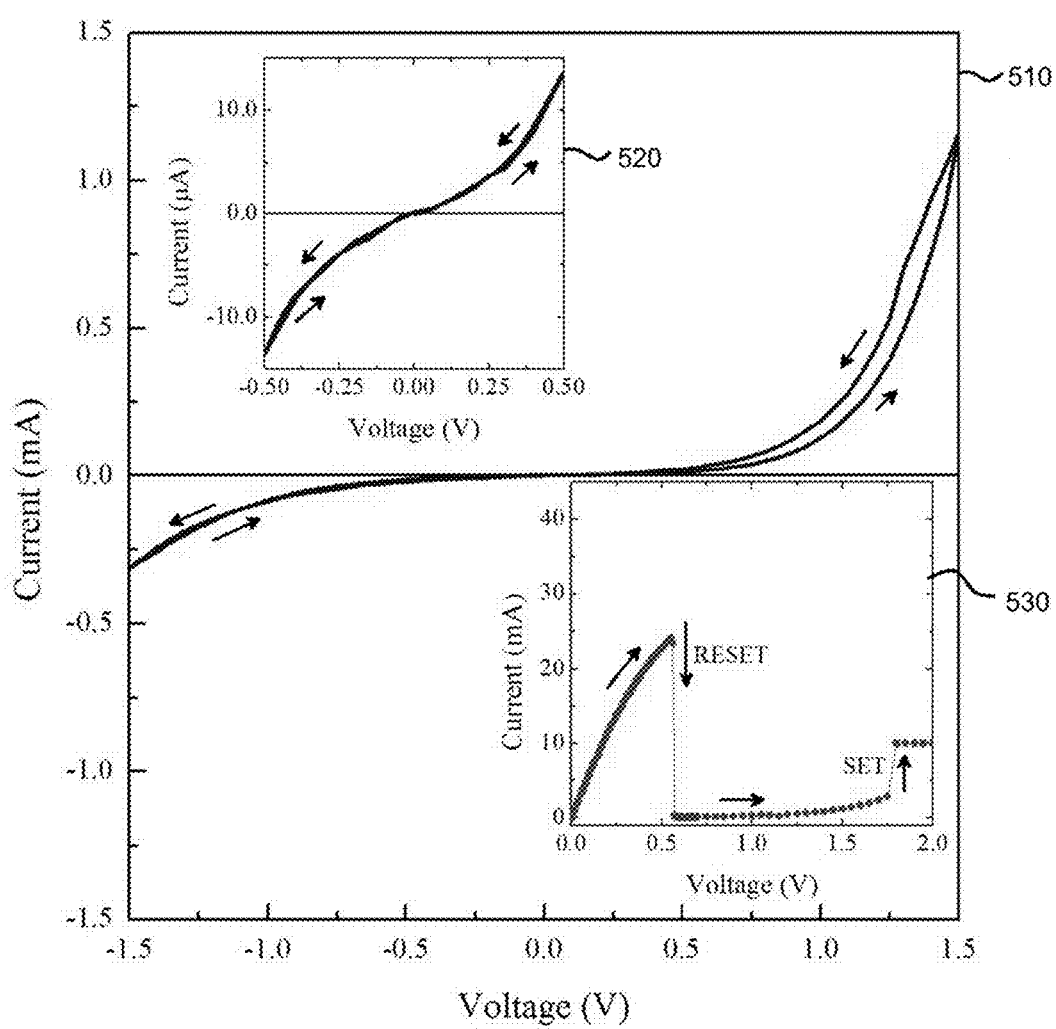
FIG. 5 is a plot and a top insert showing I-V curves of an example NiO-based capacitor-like structure (specifically, an example Pt/NiO/Pt capacitor-like structure) in the HRS (i.e. OFF state) for $V_F$ equal to 1.5 V and 5V, and a bottom insert that shows a RESET process and SET process.
Figure 6:
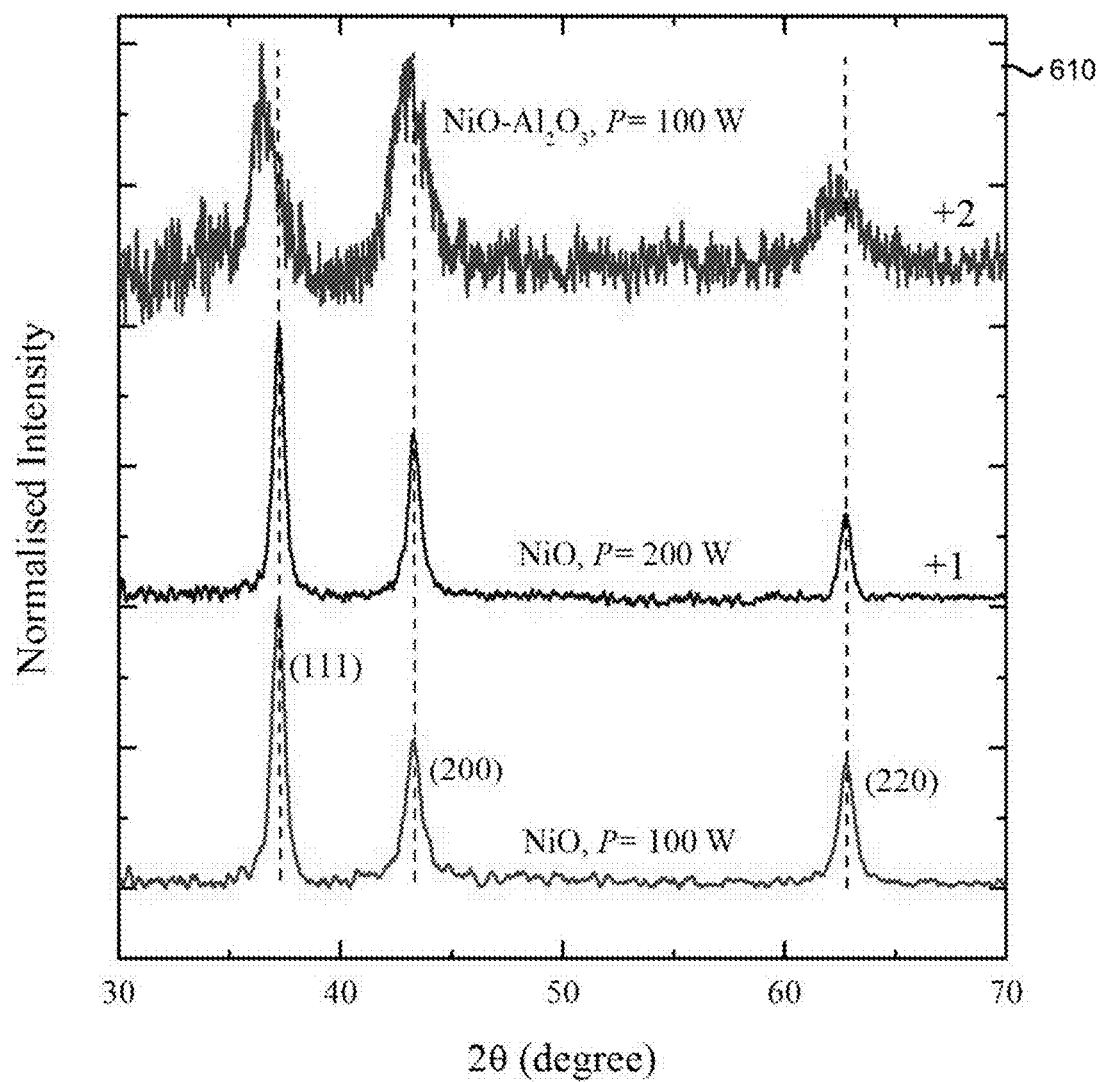
FIG. 6 is an X-ray diffraction (XRD) pattern for 100 nm thick NiO layers separately deposited at 100 W and 200 W RF powers, and also a 100 nm thick co-sputtered NiO—$Al_2O_3$ layer deposited at 100 W RF power.

For purposes of comparison, FIG. 5 is a plot 510 with a top insert 520 showing I-V curves of a NiO-based capacitor-like structure (specifically, an example Pt/NiO/Pt capacitor-like structure) in the HRS (i.e. OFF state) for V$_F$ equal to 1.5 V and 5V, respectively, and a bottom insert 520 that shows a RESET process and SET process. As can be seen, the NiO-based capacitor-like structure does not exhibit any change of sign of rectification behavior in the high resistance HRS (i.e. OFF state). The NiO-based capacitor-like structure does show a non-ohmic behavior in the HRS In addition, it was demonstrated that the NiO-Al$_2$O$_3$ layer in a Pt/NiO—Al$_2$O$_3$/Pt capacitor-like structure deposited with RF co-sputtering using a direct NiO target in an Argon atmosphere has a significantly different x-ray peak structure than a NiO layer in a Pt/NiO/Pt capacitor-like structure deposited using DC reactive sputtering using a Ni target in a partial oxygen atmosphere. FIG. 6 is an X-ray diffraction (XRD) pattern 610 for 100 nm thick NiO layers separately deposited at 100 W and 200 W RF powers and a 100 nm thick co-sputtered NiO—Al$_2$O$_3$ layer deposited at 100 W RF power. As can be seen, the x-ray data for the two NiO films are independent of the RF power, which indicates that the quality of the NiO prepared from a direct NiO target is less prone to synthesis parameters and significantly differs from that grown using DC reactive sputtering. Further, the x-ray pattern of the co-sputtered NiO—Al$_2$O$_3$ layer reveals NiO peaks with a less crystalline nature, indicating a structural difference from DC reactive sputtering.

Figure 7:
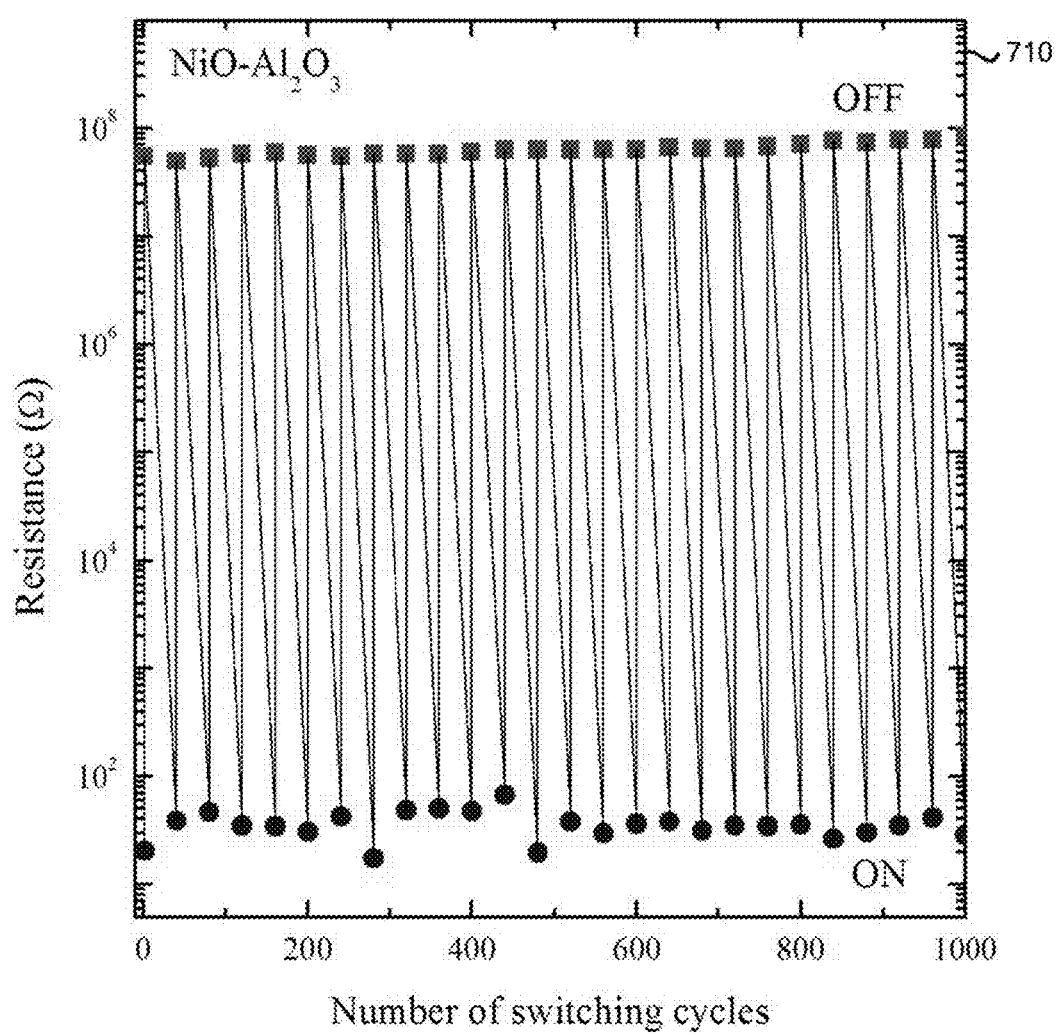
FIG. 7 is a plot showing variation in LRS (i.e. ON state) and HRS (i.e. OFF state) resistance values as a function of a number of DC switching cycles of the example Pt/NiO—$Al_2O_3$/Pt capacitor-like structure.

Turning to endurance performance, FIG. 7 is a plot 710 showing variation in LRS (i.e. ON state) and HRS (i.e. OFF state) resistance values as a function of a number of DC switching cycles of the example Pt/NiO—Al$_2$O$_3$/Pt capacitor-like structure. In each switching cycle, the RESET process and SET process were carried out by V$_{RESET}$ equal to 0.9 V and V$_{SET}$ equal to 3 V (under current compliance), respectively. The resistance in the LRS (i.e. ON state) and HRS (i.e. OFF state) was measured using the same low voltage magnitude, V$_{READ}$ equal to 0.01 V. As can be seen, the example Pt/NiO—Al$_2$O$_3$/Pt capacitor-like structure shows good endurance with a large ON-OFF ratio (approximately 10$^7$), which matches with the behavior observed in resistive switching for a voltage sweep rate of 0.2 V/s, as shown in FIG. 2.

In complex TMOs like Mn-based oxides and magnetite, Joule heating is known to play a key role behind intriguing electroresistance effects. In materials with positive or negative temperature coefficient of resistance, Joule heating can reduce or increase the resistance with increasing voltage, leading to non-ohmic conduction and electroresistance effects. For instance, exotic nonlinear I-V curves in a Mn-based oxide film (manganites) have been associated with large changes in the surface temperature of the sample due to global Joule heating effects. To examine the role of global Joule heating in the example Pt/NiO—Al$_2$O$_3$/Pt capacitor-like structure, a temperature sensor was attached on the bottom electrode to measure the concomitant variation of the surface temperature (T$_S$) during the RESET and SET processes. In such configuration, the bottom electrode may act as an electrical as well as a temperature probe of the oxide layer.

Figure 8:
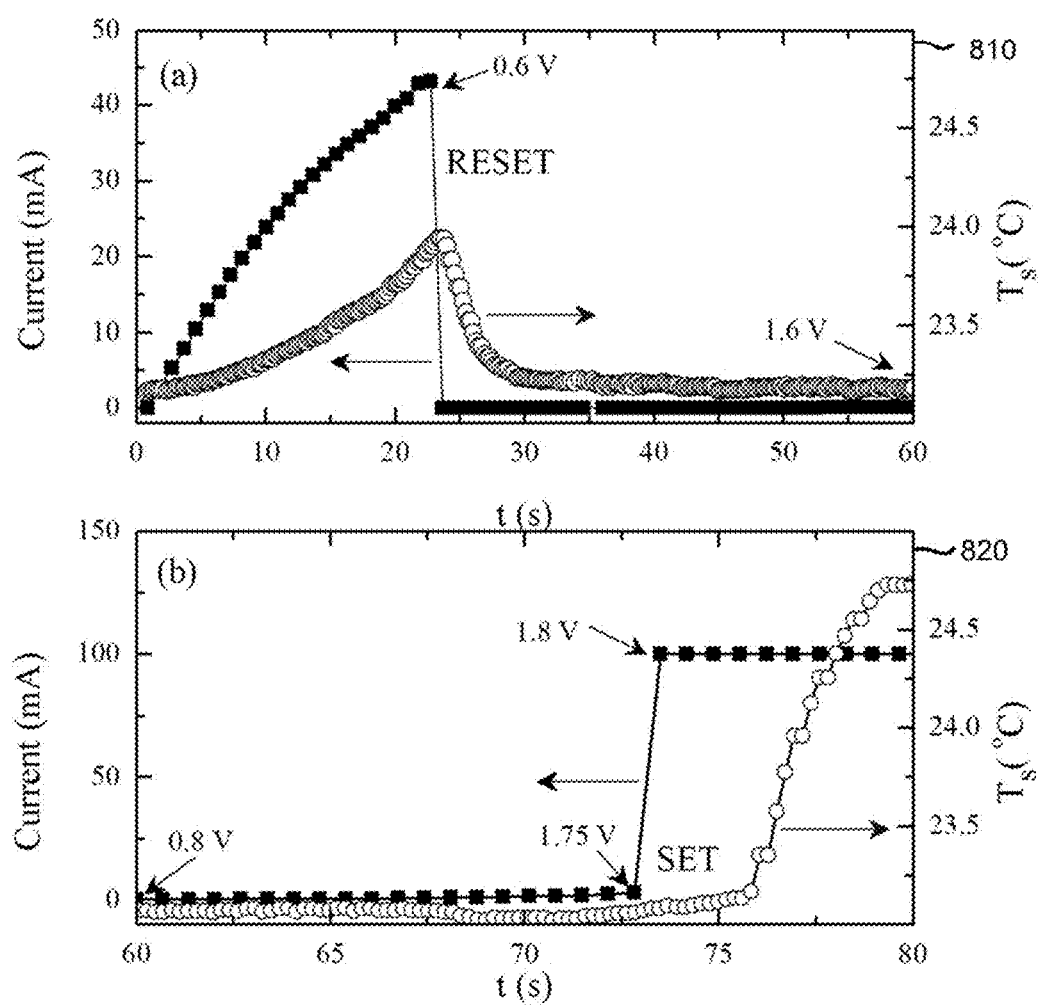
FIG. 8 is a plot showing variation of current as a function of time (t) during a RESET process when V is swept from 0 to 1.6 V in steps of 0.025 V, and a plot showing variation of current as a function of t during a SET process when V is swept from 0.8 to 1.8 to 1.35 V in steps of 0.05 V in an example Pt/NiO/Pt capacitor-like structure.

FIG. 8 is a plot 810 showing the variation of current as a function of time (t) during an RESET process when V was swept from 0 to 1.6 V in steps of 0.025 V, and a plot 820 showing the variation of current as a function of t during a SET process when V was swept from 0.8 to 1.8 to 1.35 V in steps of 0.05 V in an example Pt/NiO/Pt capacitor-like structure. Referring to plot 810, $T_S$ shows a peak around $V_{OFF}$ equal to 0.6 V and provided evidence of Joule heating during the RESET process. It should be noted that macroscopic temperature measured in this plot may be different from the local temperature of CFs. The internal temperature of conducting filaments can reach as high as 600 K. Referring to plot 820, it can be seen that current remains low and $T_S$ shows negligible change until V reaches 1.75 V at t approximately equal to 73 s during the SET process. While the current shows a drastic increase at t approximately equal to 73 s (1.75 V) during the onset of OFF-ON switching, $T_S$ does not exhibit any simultaneous abrupt change. After the transformation of the device to the LRS (i.e. ON state), the high current heats up the bottom electrode in less than a few seconds and therefore, prominent changes in $T_s$ are observed after t approximately equal to 76 s. The surface temperature of the example Pt/NiO—Al$_2$O$_3$/Pt capacitor-like structure also showed similar behavior during RESET and SET processes, thereby ruling out the contribution of global Joule heating effects, unlike in manganite thin films.

As discussed above, a capacitor-like structure 100 that includes a co-sputtered TMO layer, such as the example Pt/NiO—Al$_2$O$_3$/Pt capacitor-like structure that was experimentally tested, may have a larger ON-OFF ratio that is dependent on voltage sweep rate. Such behavior may be caused by transient energy spikes that are produced at higher voltage sweep rates, similar to capacitive turn on voltage spikes in transistors, and the associated energy may be lost as heat. This favors the disruption of even robust conducting channels and enhances the proportion of chemically transformed high resistance regions in the sample, thus leading to a larger ON-OFF ratio at higher sweep rate.

Furthermore, a Schottky-type barrier may be formed at the metal-oxide-metal junctions due to the modified band structure of the chemically transformed oxide layer in the HRS (i.e. OFF state). In the HRS a capacitor-like structure 100 that includes a co-sputtered TMO layer, such as the example Pt/NiO—Al$_2$O$_3$/Pt capacitor-like structure, there may be two metal-oxide Schottky junctions at lower voltage magnitude, which act like two back to back Schottky diodes connected in series, leading to a symmetric nonlinear I-V behavior. For voltage sweeps to higher end voltages, one of the junctions dominates the other, resulting in an asymmetric nonlinear behavior. The presence of hysteresis in the I-V curves indicates the role of charge trapping mechanisms during the voltage sweep. Charges trapped at the interface and unintentional formation of an interface capacitance layer may play a role behind the rectification behavior and hysteresis. Under an external voltage, trapping and de-trapping of charges at the interface and energetic distribution of those in the band gap may modify the barrier characteristics such as height and thickness, which in turn can change the rectification characteristics. The change of direction of rectification may be caused by holes or electrons trapped at the surface near electrodes, which can create an asymmetric electric field at the metal-semiconductor contact. Under sufficiently high negative voltage bias, an additional carrier injection is induced from the electrodes by tunneling, leading to an enhanced current and change of rectification. Alternatively, it may be a result of the impact ionization induced generation of charge carriers at higher voltages. Upon further increasing V, a percolation effect takes place in the matrix, which aids in the re-development of the favorable conducting path/paths, thus leading to an abrupt jump in the current level and enhancement in conductivity during the SET process.

Alternatives

In conclusion, it should be understood that various adaptations and modifications may be made to the above-discussed capacitor-like structure that includes a co-sputtered TMO layer (e.g., a co-sputtered NiO—Al$_2$O$_3$ layer). It should be appreciated that details included in the various example embodiments are merely provided for purposes of illustration, and are not intended to limit the scope, applicability, or configuration of the invention. For example, it should be understood that the various structures described above may be made from differing materials, have differing sizes, be connected in different manners, be implemented in different combinations, or used for different purposes, etc. without departing from the intended scope of the invention.

What is claimed is:

1. A capacitor-like structure, comprising:
   a first electrode constructed of a first metal,
   a co-sputtered transition metal oxide (TMO) layer on the first electrode, wherein the co-sputtered TMO layer is a nickel oxide (NiO)-aluminum oxide (Al$_2$O$_3$) layer having a composition of substantially 84% NiO and 16% Al$_2$O$_3$, wherein substantially refers to a percentage within ±10%;
   a second electrode constructed of a second metal in contact with the co-sputtered TMO layer,
   wherein the capacitor-like structure is resistively switchable due to formation and rupture of conducting nanofilaments (CFs) through the co-sputtered TMO layer in response to application of a voltage between the first electrode and the second electrode.

2. The capacitor-like structure of claim 1, wherein the co-sputtered TMO layer is a radio frequency (RF) co-sputtered NiO—Al$_2$O$_3$ layer.

3. The capacitor-like structure of claim 2, wherein the RF co-sputtered NiO—Al$_2$O$_3$ layer is grown using at least one direct oxide target in a noble gas atmosphere.

4. The capacitor-like structure of claim 1, wherein the first metal and the second metal are each platinum (Pt).

5. The capacitor-like structure of claim 1, wherein the capacitor-like structure is constructed to exhibit a change of sign of rectification behavior from positive to negative in response to an increase in end voltage.

6. The capacitor-like structure of claim 1, wherein the capacitor-like structure is a portion of a resistive random access memory (ReRAM).

7. A resistive random access memory (ReRAM), comprising:
   one or more capacitor-like structures each including
      a first electrode constructed of platinum (Pt),
      a co-sputtered aluminum oxide (Al$_2$O$_3$)-nickel oxide (NiO) layer on the first electrode; and
      a second electrode constructed of platinum (Pt) in contact with the co-sputtered Al$_2$O$_3$—NiO layer,
   wherein each capacitor-like structure is resistively switchable between a low-resistance state ("LRS") and a high-resistance state ("HRS") state, and vice versa in response to application of a voltage between the capacitor-like structure's first electrode and second electrode.

8. The ReRAM of claim 7, wherein the co-sputtered NiO—Al$_2$O$_3$ layer has a composition of substantially 84% NiO and 16% Al$_2$O$_3$, wherein substantially refers to a percentage within ±10%.

9. The ReRAM of claim 7, wherein the co-sputtered NiO—$Al_2O_3$ layer is a radio frequency (RF) co-sputtered NiO—$Al_2O_3$ layer.

10. The ReRAM of claim 9, wherein the RF co-sputtered NiO—$Al_2O_3$ layer is grown using at least a direct NiO target in an argon (AR) atmosphere.

11. The ReRAM of claim 7, wherein the capacitor-like structure is constructed to exhibit a change of sign of rectification behavior from positive to negative in response to an increase in end voltage.

12. A method for constructing a capacitor-like structure, comprising:
    forming a first electrode on a substrate;
    using co-sputtering to deposit a transition metal oxide (TMO) layer on the first electrode, wherein the TMO layer is a co-sputtered aluminum oxide ($Al_2O_3$)-nickel oxide (NiO) layer; and
    forming a second electrode in contact with the co-sputtered NiO—$Al_2O_3$ layer,
    wherein the capacitor-like structure is resistively switchable due to formation and rupture of conducting nanofilaments (CFs) through the co-sputtered NiO—$Al_2O_3$ layer in response to application of a voltage between the first electrode and the second electrode.

13. The method of claim 12, wherein the co-sputtered NiO—$Al_2O_3$ layer has a composition of substantially 84% NiO and 16% $Al_2O_3$, wherein substantially refers to a percentage within ±10%.

14. The method of claim 12, wherein the using co-sputtering comprises:
    using RF co-sputtering to deposit the co-sputtered $Al_2O_3$—NiO layer on the first electrode.

15. The method of claim 14, wherein the RF co-sputtered is performed using at least a direct NiO target in a noble gas atmosphere.

16. The method of claim 12, wherein the first electrode and the second electrode are each formed of platinum (Pt).

17. The method of claim 12, wherein the capacitor-like structure is constructed as a portion of a resistive random access memory (ReRAM).

* * * * *